(12) United States Patent
Campbell et al.

(10) Patent No.: US 10,050,010 B1
(45) Date of Patent: Aug. 14, 2018

(54) SELECTIVELY CROSS-LINKED THERMAL INTERFACE MATERIALS

(71) Applicant: International Business Machines Corporation, Armonk, NY (US)

(72) Inventors: Eric J. Campbell, Rochester, MN (US); Sarah K. Czaplewski, Rochester, MN (US); Elin Labreck, Rochester, MN (US); Jennifer I. Porto, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/465,872

(22) Filed: Mar. 22, 2017

(51) Int. Cl.
*H01L 23/367* (2006.01)
*H01L 23/00* (2006.01)
*H01L 23/373* (2006.01)
*C09K 5/10* (2006.01)

(52) U.S. Cl.
CPC ............... *H01L 24/83* (2013.01); *C09K 5/10* (2013.01); *H01L 23/3675* (2013.01); *H01L 23/3737* (2013.01); *H01L 24/32* (2013.01); *H01L 2224/29191* (2013.01); *H01L 2224/32245* (2013.01); *H01L 2224/83201* (2013.01); *H01L 2224/83874* (2013.01); *H01L 2924/0635* (2013.01); *H01L 2924/0665* (2013.01); *H01L 2924/0715* (2013.01); *H01L 2924/1434* (2013.01); *H01L 2924/20211* (2013.01); *H01L 2924/20212* (2013.01); *H01L 2924/20213* (2013.01)

(58) Field of Classification Search
CPC ..... H01L 24/83; H01L 24/32; H01L 23/3675; H01L 23/3737; H01L 2224/29191; H01L 2224/32245; H01L 2224/83201; H01L 2224/83874
See application file for complete search history.

(56) References Cited

U.S. PATENT DOCUMENTS

| 4,585,670 A | 4/1986 | Liu |
| 5,968,606 A * | 10/1999 | Osuna ................. C09D 11/101 |
| | | 257/717 |
| 6,891,259 B2 | 5/2005 | Im et al. |

(Continued)

OTHER PUBLICATIONS

Fawcett et al., *Phototunable Cross-Linked Polysiloxanes*, Macromolecules, vol. 48, No. 18, Sep. 2015, pp. 6499-6507, American Chemical Society (ACS) Publications, Washington, DC.

(Continued)

*Primary Examiner* — Michael Trinh
(74) *Attorney, Agent, or Firm* — Roy R. Salvagio; Robert R. Williams; Kennedy Lenart Spraggins LLP

(57) ABSTRACT

A process of forming a thermal interface material structure includes selectively masking a putty pad that includes ultraviolet (UV) curable cross-linkers to form a masked putty pad. The masked putty pad has a first area that is exposed and a second area that is masked. The process also includes exposing the masked putty pad to UV light to form a selectively cross-linked putty pad. The process includes disposing the selectively cross-linked putty pad between an electrical component and a heat spreader to form an assembly. The process further includes compressing the assembly to form a thermal interface material structure that includes a selectively cross-linked thermal interface material.

3 Claims, 4 Drawing Sheets

(56) References Cited

U.S. PATENT DOCUMENTS

| | | | |
|---|---|---|---|
| 6,938,783 B2* | 9/2005 | Chung | B32B 7/12 |
| | | | 206/713 |
| 7,312,527 B2 | 12/2007 | Sane et al. | |
| 8,492,199 B2 | 7/2013 | Coffin et al. | |
| 8,633,478 B2 | 1/2014 | Cummings et al. | |
| 8,741,969 B2* | 6/2014 | Otani | A61L 31/045 |
| | | | 514/774 |
| 2009/0214870 A1* | 8/2009 | Morita | C08G 59/40 |
| | | | 428/413 |
| 2011/0233756 A1* | 9/2011 | Khandekar | H01L 23/3737 |
| | | | 257/712 |
| 2015/0334871 A1* | 11/2015 | Hill | H05K 7/2039 |
| | | | 165/185 |

OTHER PUBLICATIONS

Wertz et al., *Thermally Conductive-Silicone Composites with Thermally Reversible Cross-links*, ACS Applied Materials & Interfaces, vol. 8, No. 22, May 2016, pp. 13669-13672, American Chemical Society (ACS) Publications, Washington, DC.

Sangermano et al., *UV-Activated Hydrosilation Reaction for Silicone Polymer Crosslinking*, Journal of Applied Polymer Science, vol. 128, No. 3, May 2013, pp. 1521-1526, John Wiley & Sons, Inc., Hoboken, NJ.

Holwell et al., *Global Release Liner Industry Conference 2008*, Platinum Metals Review, vol. 52, No. 4, Oct. 2008, pp. 243-246, Johnson Matthey PLC, Royston, Hertfordshire, UK.

AUS920160662US1, Appendix P; List of IBM Patent or Applications Treated as Related, Feb. 8, 2018, 2 pages.

Campbell et al., *Selectively Cross-Linked Thermal Interface Materials*, IBM, U.S. Appl. No. 15/813,676, filed Nov. 15, 2017, 20 pages.

* cited by examiner

SELECTIVELY CROSS-LINKED THERMAL INTERFACE MATERIALS

BACKGROUND

In an electronic device, a thermal interface material (also referred to as a "TIM") is a material (e.g., a grease or a putty) that is disposed between a heat generating component of an electronic device (e.g., a die, a memory component, an inductor, etc.) and a heat spreader in order to facilitate efficient heat transfer between the heat generating component and the heat spreader. The powering up or powering down of the electronic device may cause a relative motion between the heat generating component and the heat spreader, including in-plane motion and out-of-plane motion. This relative motion may cause the thermal interface material to squeeze out of the interface gap. This phenomenon is commonly referred to as "pump-out" of the thermal interface material and results in increased thermal resistance due to loss of material from the interface. Additionally, in the context of vertical TIM applications, another disadvantage associated with the use of grease/putty thermal interface materials is that such materials have a propensity to "creep" from the interface over time, which results in increased thermal resistance due to loss of material from the interface.

SUMMARY

According to an embodiment, a process of forming a thermal interface material structure is disclosed. The process includes selectively masking a putty pad that includes ultraviolet (UV) curable cross-linkers to form a masked putty pad. The masked putty pad has a first area that is exposed and a second area that is masked. The process also includes exposing the masked putty pad to UV light to form a selectively cross-linked putty pad. The process includes disposing the selectively cross-linked putty pad between an electrical component and a heat spreader to form an assembly. The process further includes compressing the assembly to form a thermal interface material structure that includes a selectively cross-linked thermal interface material.

According to another embodiment, a process of forming a thermal interface material structure is disclosed. The process includes applying a grease that includes UV curable cross-linkers to a surface of an electrical component, to a surface of a heat spreader, or a combination thereof. The process also includes forming an assembly by compressing the grease between the electrical component and the heat spreader. The process further includes exposing the assembly to UV light to form a thermal interface material structure that includes a selectively cross-linked thermal interface material.

According to another embodiment, a thermal interface material structure is disclosed that includes a selectively cross-linked thermal interface material. The selectively cross-linked thermal interface material includes a first area having UV curable cross-linkers in a cross-linked state and a second area having the UV curable cross-linkers in a non-crosslinked state.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
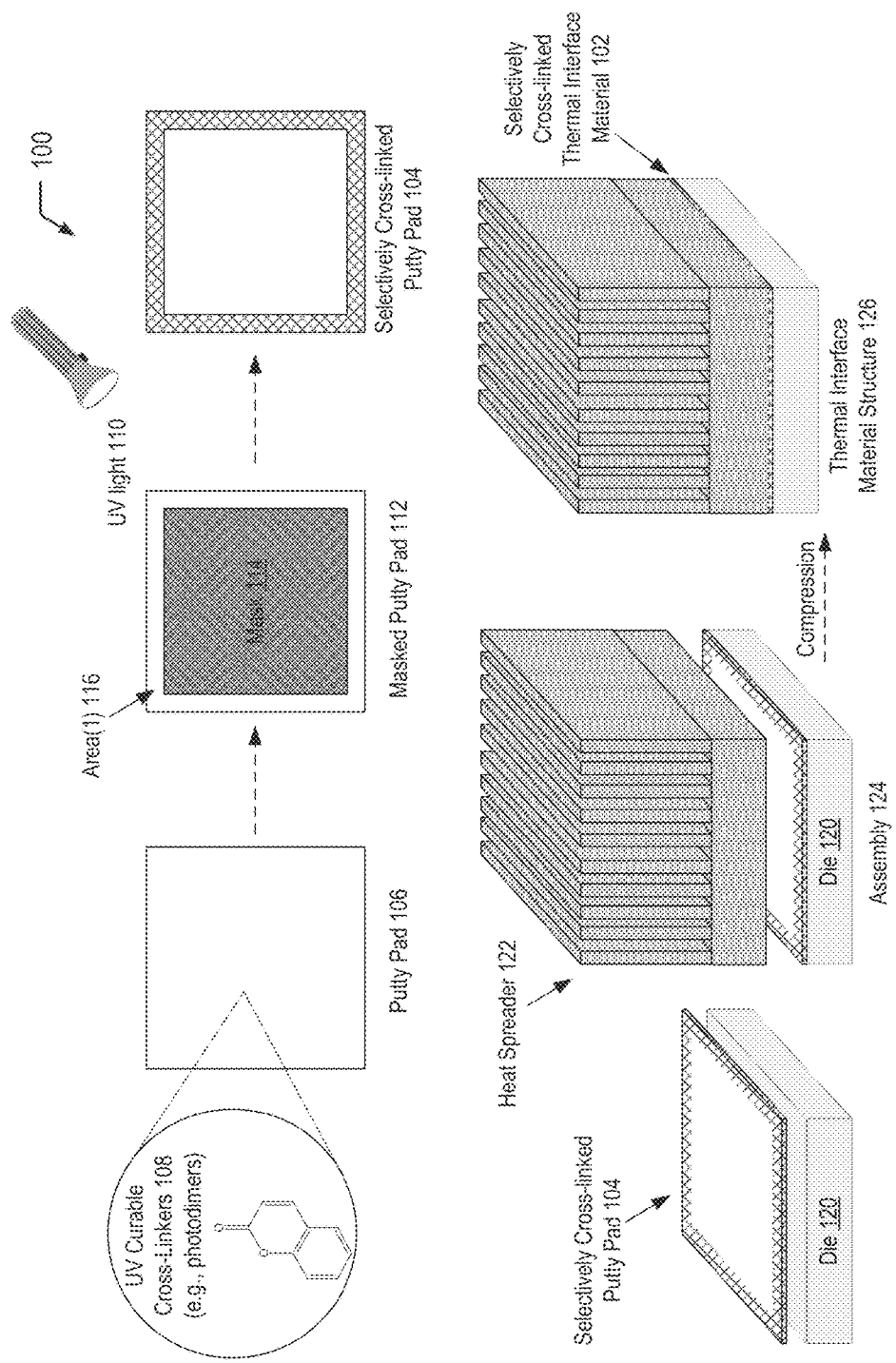
FIG. 1 is a diagram illustrating a first example of a process of forming a selectively cross-linked thermal interface material, according to one embodiment.

The present disclosure describes selectively cross-linked thermal interface materials and processes of forming the selectively cross-linked thermal interface materials. In the present disclosure, cross-linking moieties that are triggered using ultraviolet (UV) light (also referred to herein as "UV curable cross-linkers") are utilized to form the selectively cross-linked thermal interface materials. In order to reduce thermal interface material migration (e.g., resulting from pump-out and/or creep of TIM material from the interface), curing of the UV curable cross-linkers may be limited to selected areas of an interface between an electrical component that generates heat during electronic device operations (e.g., a die, a memory component, an inductor, etc.) and a heat spreader. For example, exposure to UV light may be limited to a first area of the interface (e.g., along the outer edges of the interface) in order to initiate a cross-linking reaction in the first area but not in a second area of the interface (e.g., in the central region of the interface away from the edges) that represents a majority of the interface area. Such selective exposure to UV light results in a thermal interface material that is cross-linked in the first area (also referred to herein as a "cross-linked region" or a "cured region") and that is not cross-linked in the second area (also referred to herein as an "uncured region"). The cured region is stiffer and less compliant than the uncured region. For applications where highly compliant thermal interface materials are required, the thermal interface materials of the present disclosure may be advantageous because the majority of the thermal interface material remains compliant, while the edges are stiffened to mitigate material pump-out and/or creep.

In one embodiment, a pad of putty (also referred to herein as a "putty pad") may be used. The putty pad (e.g., a pre-cut pad or a pad formed from a dispensable putty) may include a mixture of materials that includes UV curable cross-linkers. In some cases, a photo-initiator may be utilized to initiate or catalyze the UV reaction. An illustrative, non-limiting embodiment of a photo-initiator that may be utilized for silicone acrylates is 2-hydroxy-2-methylpropiophenone. It will be appreciated that an alternative photo-initiator may be selected by one of ordinary skill in the art based on the particular UV curable cross-linkers that are used. The putty pad is masked in the second area, and the first area is then exposed to UV light such that the cross-linking reaction occurs in the first area (e.g., along the edges of the pad) but not in the second area (e.g., the central region of the pad) to form a selectively cross-linked putty pad. The selectively cross-linked putty pad is subsequently disposed between an electrical component and a heat spreader and then compressed. In this example, the central region of the selectively cross-linked putty pad remains compliant to conform to the surfaces of the die and the heat spreader, while the stiffer edges mitigate material pump-out and/or creep. While FIGS. 1 and 2 depict an example in which the electrical component is a die, it will be appreciated that the selectively cross-linked putty pad may be disposed between another type of electrical component (e.g., a memory component, an inductor, etc.) and the heat spreader.

In another embodiment, a grease may be utilized, where the grease includes a mixture of materials that includes UV curable cross-linkers. In some cases, a photo-initiator may be utilized to initiate or catalyze the UV reaction. An illustrative, non-limiting embodiment of a photo-initiator that may be utilized for silicone acrylates is 2-hydroxy-2-methylpropiophenone. It will be appreciated that an alternative photo-initiator may be selected by one of ordinary skill in the art based on the particular UV curable cross-linkers that are used. In this case, the grease may be applied between the electrical component and the heat spreader in order to achieve a desired bond line. Subsequently, the edges of the assembly are exposed to UV light such that the cross-linking reaction occurs along the edges of the assembly. After the cross-linking reaction, the stiffened edges mitigate material pump-out and/or creep.

Figure 2:
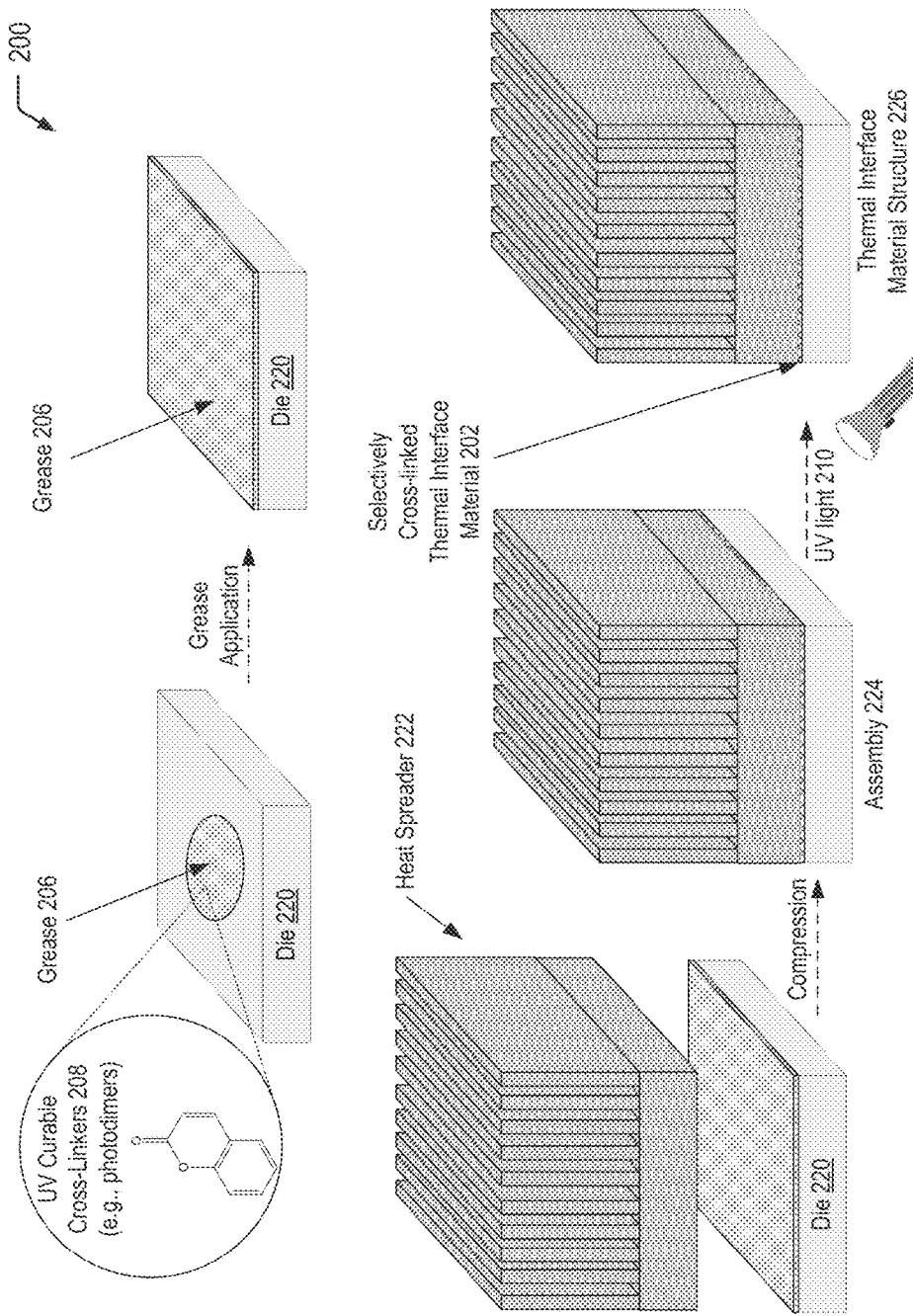
FIG. 2 is a diagram illustrating a second example of a process of forming a selectively cross-linked thermal interface material, according to one embodiment.

FIG. 1 is a diagram 100 illustrating an example of a process of forming a selectively cross-linked thermal interface material 102, according to one embodiment. The top portion of FIG. 1 illustrates that a selectively cross-linked putty pad 104 may be formed via selective exposure of a putty pad 106 (that includes UV curable cross-linkers 108) to UV light 110. The bottom portion of FIG. 1 illustrates that the selectively cross-linked putty pad 104 may subsequently be disposed between an electrical component, such as a die 120 or another type of electrical component that generates heat during electronic device operations (e.g., a memory component, an inductor, etc.) and a heat spreader 122 to form an assembly 124. The assembly 124 is then compressed to form a thermal interface material structure 126 that includes the selectively cross-linked thermal interface material 102. In this example, the central region of the selectively cross-linked putty pad 104 remains compliant to conform to the surfaces of the die 120 and the heat spreader 122, while the stiffer edges mitigate material pump-out and/or creep. For applications where highly compliant thermal interface materials are required, the selectively cross-linked thermal interface material 102 of FIG. 1 may be advantageous because the majority of the thermal interface material remains compliant, while the edges are stiffened to mitigate material pump-out and/or creep.

Referring to the top portion of FIG. 1, the putty pad 106 that includes the UV curable cross-linkers 108 is selectively masked to form a masked putty pad 112, and the masked putty pad 112 is subsequently exposed to a particular wavelength of UV light to form the selectively cross-linked putty pad 104. FIG. 1 illustrates that the putty pad 106 has a shape that is appropriate for the particular features of the die 120 and the heat spreader 122 depicted at the bottom of FIG. 1. The putty pad 106 may include a pre-cut pad having the appropriate shape or may be formed from dispensable putty into the appropriate shape.

In some embodiments, the UV curable cross-linkers 108 of the putty pad 106 may include epoxy, acrylate, vinyl, dimers, or other UV responsive moieties. For illustrative purposes only, FIG. 1 depicts an embodiment in which the UV curable cross-linkers 108 include molecules that may undergo a photodimerization reaction, with the resulting dimer representing an example of a cross-linked material. In a particular embodiment, the putty pad 106 may include a silicone material, and the UV curable cross-linkers 108 may be covalently bonded to the silicone material. In some embodiments, the UV curable cross-linkers 108 may include a compound (e.g., coumarin, in the illustrative example of FIG. 1) that may reversibly cross-link via a reversible photodimerization reaction. In such cases, when the compound is exposed to UV light of a particular wavelength (e.g., above 350 nm in the case of coumarin), the compound undergoes a photodimerization reaction (for selective cross-linking). While not shown in the example of FIG. 1, subsequent exposure to UV light of a different wavelength (e.g., less than 260 nm, in the case of coumarin) may reverse the cross-linking and dimerization, returning to the original compound (a non-crosslinked state).

Examples of such compounds include coumarin, anthracene, cinnamic acid, thymine, and stilbene (among numerous other alternatives). To illustrate, a coumarin compound may undergo a dimerization reaction when exposed to UV light above 350 nm, and the dimerization reaction may be reversed via exposure to UV light below 260 nm. An anthracene compound may undergo a dimerization reaction when exposed to UV light above 350 nm, and the dimerization reaction may be reversed via exposure to UV light below 300 nm. A cinnamic acid compound may undergo a dimerization reaction when exposed to UV light above 300 nm, and the dimerization reaction may be reversed via exposure to UV light below 260 nm. A thymine compound may undergo a dimerization reaction when exposed to UV light above 300 nm, and the dimerization reaction may be reversed via exposure to UV light below 260 nm. A stilbene compound may undergo a dimerization reaction when exposed to UV light above 300 nm, and the dimerization reaction may be reversed via exposure to UV light below 260 nm.

A typical thermal interface material "rework" process entails the replacement of pads or removal of material. Selection of the UV curable cross-linkers 108 that have the ability to undergo reversible photodimerization may enable the selectively cross-linked thermal interface material 102 to be reversed back to its original state for reworking operations and selectively cured again to retain its thermal integrity resistance. In contrast to typical thermal interface rework procedures, utilizing the selectively cross-linked thermal interface material 102 of the present disclosure may enable rework operations to be performed without potential device damage associated with material removal while also preventing material waste. Further, the reversible nature of the photodimerization reaction may enable tuning of the thermal interface material properties. The ability to tune the thermal interface material properties may be beneficial for rework, changing operating environments, or operating in harsh environments, among other benefits.

Referring to the middle of the top portion of FIG. 1, a mask 114 is applied to the putty pad 106 to form the masked putty pad 112. After application of the mask 114 to the putty pad 106, FIG. 1 illustrates that a first area 116 (identified as "Area(1)" in FIG. 1) of the masked putty pad 112 remains unmasked for subsequent exposure to the UV light 110, and the mask 114 prevents a second area beneath the mask 114 from being exposed to the UV light 110. In the example depicted in FIG. 1, the first area 116 corresponds to the edges of the putty pad 106, while the second area corresponds to the central region and represents a majority of the surface area of the putty pad 106. Referring to the right side of the top portion of FIG. 1, the masked putty pad 112 is then exposed to the UV light 110 such that the cross-linking reaction occurs in the first area 116 (e.g., along the pad edges). The mask 114 may then be removed to form the selectively cross-linked putty pad 104.

The bottom portion of FIG. 1 shows that the selectively cross-linked putty pad 104 may be used to form the selectively cross-linked thermal interface material 102. Referring to the left side of the bottom portion of FIG. 1, the selectively cross-linked putty pad 104 may be disposed between the die 120 and the heat spreader 122 to form the assembly 124. Referring to the right side of the bottom portion of FIG. 1, the assembly 124 may be compressed to form the thermal interface material structure 126 that includes the selectively cross-linked thermal interface material 102.

Thus, FIG. 1 illustrates an example of a process of forming a selectively cross-linked thermal interface material, according to one embodiment. In the example of FIG. 1, the selectively cross-linked thermal interface material is formed from a selectively cross-linked putty pad that is disposed between an electrical component that generates heat during electronic device operations (e.g., a die) and a heat spreader and then compressed. In this example, the central region of the selectively cross-linked putty pad remains compliant to conform to the surfaces of the electrical component and the heat spreader, while the stiffer edges mitigate material pump-out and/or creep. For applications where highly compliant thermal interface materials are required, the selectively cross-linked thermal interface material of FIG. 1 may be advantageous because the majority of the thermal interface material remains compliant, while the edges are stiffened to mitigate material pump-out and/or creep. Further, in some cases, the selectively cross-linked thermal interface material of FIG. 1 may include compounds that undergo reversible photodimerization when exposed to UV light. Such compounds may enable TIM rework operations to be performed without the potential device damage and material waste associated with a typical TIM rework process that entails the replacement of pads or removal of material, among other benefits.

Referring to FIG. 2, a diagram 200 illustrates an example of a process of forming a selectively cross-linked thermal interface material 202, according to one embodiment. In contrast to the putty pad 106 of FIG. 1, the top portion of FIG. 2 illustrates that a grease 206 (that includes UV curable cross-linkers 208) may be applied to a surface of an electrical component, such as a die 220, (and/or a surface of a heat spreader 222) in order to achieve a desired bond line. The bottom portion of FIG. 2 illustrates that the grease 206 may be compressed between the die 220 and the heat spreader 222 to form an assembly 224. Subsequently, the edges of the assembly 224 are exposed to UV light 210 such that the cross-linking reaction occurs along the edges of the assembly 224. After the cross-linking reaction, the stiffened edges mitigate material pump-out and/or creep. For applications where highly compliant thermal interface materials are required, the selectively cross-linked thermal interface material 202 of FIG. 2 may be advantageous because the majority of the thermal interface material remains compliant, while the edges are stiffened to mitigate material pump-out and/or creep.

Referring to the left side of the top portion of FIG. 2, the grease 206 may include a mixture of materials that includes the UV curable cross-linkers 208. In some embodiments, the UV curable cross-linkers 208 may include epoxy, acrylate, vinyl, dimers, or other UV responsive moieties. For illustrative purposes only, FIG. 2 depicts an embodiment in which the UV curable cross-linkers 208 include molecules that may undergo a photodimerization reaction, with the resulting dimer representing an example of a cross-linked material. In a particular embodiment, the grease 206 may include a silicone material, and the UV curable cross-linkers 208 may be covalently bonded to the silicone material. In some embodiments, the UV curable cross-linkers 208 may include a compound (e.g., coumarin, in the illustrative example of FIG. 2) that may reversibly cross-link via a reversible photodimerization reaction. As previously described herein with respect to FIG. 1, examples of such compounds include coumarin, anthracene, cinnamic acid, thymine, and stilbene (among numerous other alternatives).

Selection of the UV curable cross-linkers 208 that have the ability to undergo reversible photodimerization may enable the selectively cross-linked thermal interface material 202 to be reversed back to its original state for reworking operations and selectively cured again to retain its thermal resistance integrity. In contrast to typical thermal interface rework procedures, utilizing the selectively cross-linked thermal interface material 202 of FIG. 2 may enable rework operations to be performed without potential device damage associated with material removal while also preventing material waste. Further, the reversible nature of the photodimerization reaction may enable tuning of the thermal interface material properties. The ability to tune the thermal interface material properties may be beneficial for rework, changing operating environments, or operating in harsh environments, among other benefits.

The bottom portion of FIG. 2 shows the formation of the selectively cross-linked thermal interface material 202 after application of the grease 206. Referring to the left side of the bottom portion of FIG. 2, the grease 206 is disposed between the die 220 and the heat spreader 222, followed by compression to form the assembly 224. Referring to the right side of the bottom portion of FIG. 2, the assembly 224 may be exposed to UV light 210 to form a thermal interface material structure 226 that includes the selectively cross-linked thermal interface material 202.

Thus, FIG. 2 illustrates an example of a process of forming a selectively cross-linked thermal interface material, according to one embodiment. In the example of FIG. 2, the selectively cross-linked thermal interface material is formed from a grease that includes a mixture of materials that includes UV curable cross-linkers. FIG. 2 illustrates that the grease may be applied between an electrical component that generates heat during electronic device operations (e.g., a die) and the heat spreader in order to achieve the desired bond line. Subsequently, the edges of the assembly are exposed to UV light such that the cross-linking reaction occurs along the edges of the assembly to form the selectively cross-linked thermal interface material. For applications where highly compliant thermal interface materials are required, the selectively cross-linked thermal interface material of FIG. 2 may be advantageous because the majority of the thermal interface material remains compliant, while the edges are stiffened to mitigate material pump-out and/or creep. Further, in some cases, the selectively cross-linked thermal interface material of FIG. 2 may include compounds that undergo reversible photodimerization when exposed to UV light. Such compounds may enable TIM rework operations to be performed without the potential device damage and material waste associated with a typical TIM rework process that entails the replacement of pads or removal of material, among other benefits.

Figure 3:
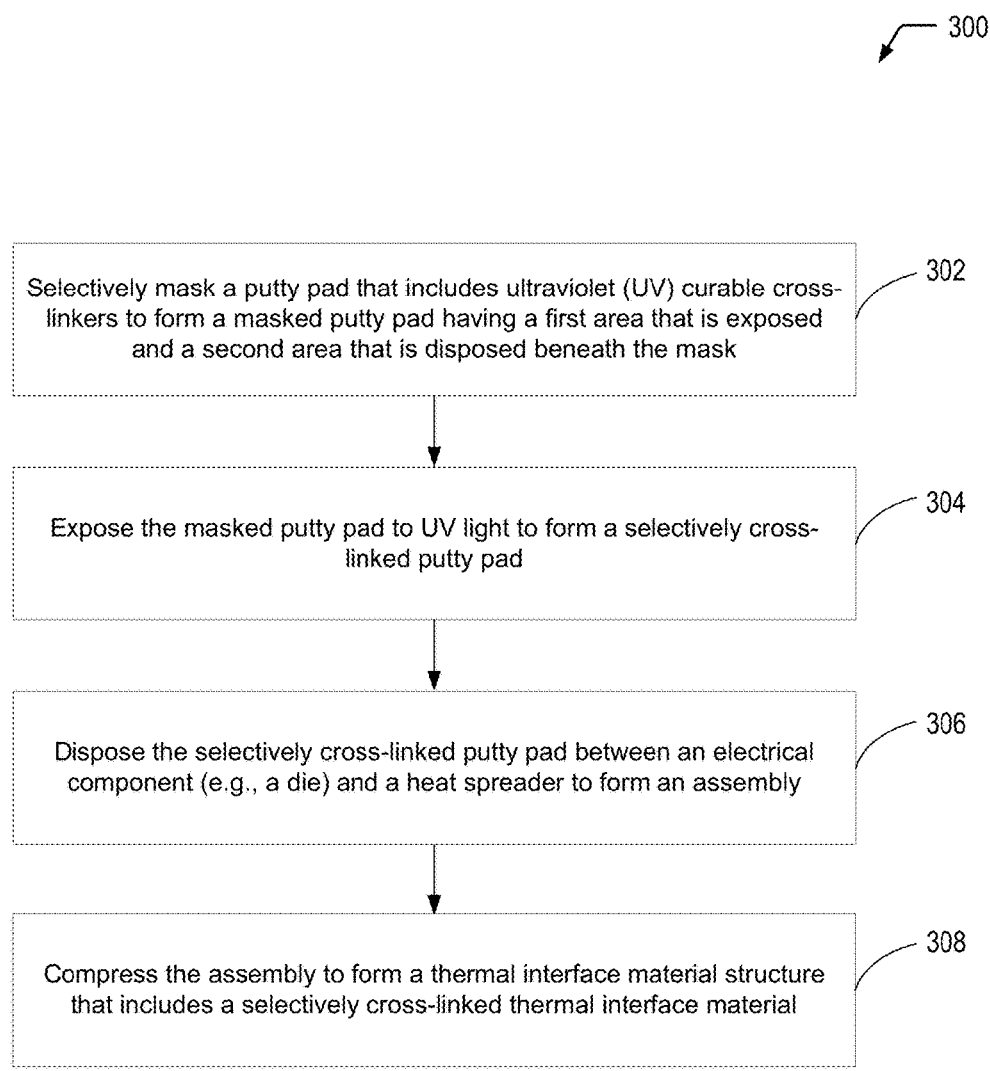
FIG. 3 is a flow diagram depicting a particular embodiment of a process of forming a selectively cross-linked thermal interface material.

Referring to FIG. 3, a flow diagram illustrates an example of a process 300 of forming a selectively cross-linked thermal interface material, according to one embodiment. In the example of FIG. 3, the selectively cross-linked thermal interface material is formed from a selectively cross-linked putty pad that includes UV curable cross-linkers. A central region of the selectively cross-linked putty pad remains compliant to conform to surfaces of an electrical component that generates heat during electronic device operations (e.g., a die, a memory component, an inductor, etc.) and a heat spreader, while the stiffer edges mitigate material pump-out and/or creep. Such properties may be particularly advantageous in applications where highly compliant thermal interface materials are required. It will be appreciated that the operations shown in FIG. 3 are for illustrative purposes only and that the operations may be performed in alternative orders, at alternative times, by a single entity or by multiple entities, or a combination thereof. For example, one entity may form a putty pad (e.g., a pre-cut pad or a pad that is formed from dispensable putty), while the same entity or a different entity may form the masked putty pad (illustrated as operation 302 in FIG. 3). In some cases, the same entity or a different entity may expose the masked putty pad to UV light to form a selectively cross-linked putty pad (illustrated as operation 304 in FIG. 3). Additionally, the same entity or a different entity may form a thermal interface material structure that includes a selectively cross-linked thermal interface material by compressing the selectively cross-linked putty pad between an electrical component and a heat spreader (illustrated as operations 306 and 308 in FIG. 3).

The process 300 includes selectively masking a putty pad that includes UV curable cross-linkers to form a masked putty pad, at 302. The masked putty pad has a first area that is exposed and a second area that is disposed beneath the mask. For example, referring to FIG. 1, the putty pad 106 that includes the UV curable cross-linkers 108 may be used to form the masked putty pad 112. The mask 114 that is applied to the putty pad 106 has a shape that is selected such that a majority of the surface area of the putty pad 106 is not exposed to the UV light 110. In the example of FIG. 1, the putty pad 106 has a square/rectangular shape, and the first area 116 that is not covered by the mask 114 corresponds to the horizontal and vertical edges of the putty pad 106. It will be appreciated that alternative putty pad shapes may be utilized, and the exposed areas may have alternative shapes and/or sizes that are appropriate for a particular combination of a die and a heat spreader.

The process 300 includes exposing the masked putty pad to UV light to form a selectively cross-linked putty pad, at 304. For example, referring to FIG. 1, the masked putty pad 112 is exposed to the UV light 110 to form the selectively cross-linked putty pad 104. As described previously herein, the UV curable cross-linkers 108 may include a variety of materials, and a particular wavelength of the UV light 110 is appropriate to initiate a cross-linking reaction for the particular material(s). In the illustrative, non-limiting example depicted in FIG. 1, the UV curable cross-linkers 108 include a coumarin material that undergoes reversible photodimerization when exposed to UV light having a wavelength that is greater than 350 nm.

The process 300 includes disposing the selectively cross-linked putty pad between an electrical component (e.g., a die, a memory component, an inductor, etc.) and a heat spreader to form an assembly, at 306. For example, referring to the bottom portion of FIG. 1, the selectively cross-linked putty pad 104 may be disposed between the die 120 and the heat spreader 122 to form the assembly 124.

The process 300 includes compressing the assembly to form a thermal interface material structure that includes a selectively cross-linked thermal interface material, at 308. For example, referring to FIG. 1, the assembly 124 may be compressed to form the thermal interface material structure 126 that includes the selectively cross-linked thermal interface material 102.

While not shown in the example of FIG. 3, in cases where the UV curable cross-linkers 108 have the ability to undergo reversible photodimerization, the process 300 may further include exposing the selectively cross-linked thermal interface material 102 to UV light of an appropriate wavelength to reverse the dimerization reaction. For example, in the illustrative, non-limiting example depicted in FIG. 1, the photodimerization reaction may be reversed when the selectively cross-linked thermal interface material 102 is exposed to UV light having a wavelength that is less than 260 nm. As previously described herein, the ability to reverse the cross-linking reaction may enable rework operations to be performed without the potential device damage and material waste associated with typical thermal interface rework procedures, among other benefits.

Thus, FIG. 3 illustrates an example of a process of forming a selectively cross-linked thermal interface material. For applications where highly compliant thermal interface materials are required, the selectively cross-linked thermal interface material formed according to the process depicted in FIG. 3 may be advantageous because the majority of the thermal interface material remains compliant, while the edges are stiffened to mitigate material pump-out and/or creep.

Figure 4:
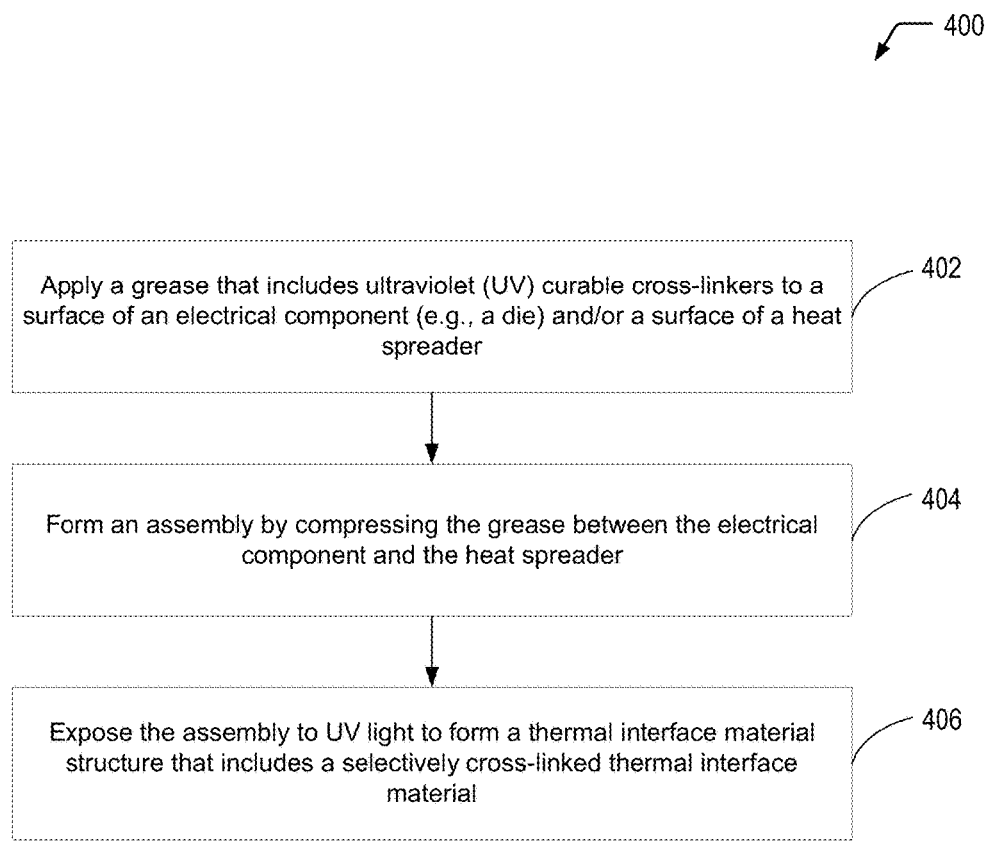
FIG. 4 is a flow diagram depicting a particular embodiment of a process of forming a selectively cross-linked thermal interface material.

Referring to FIG. 4, a flow diagram illustrates an example of a process 400 of forming a selectively cross-linked thermal interface material, according to one embodiment. In the example of FIG. 4, the selectively cross-linked thermal interface material is formed from a grease that includes UV curable cross-linkers. After application of the grease to a surface of an electrical component, such as a die, and/or a surface of a heat spreader in order to achieve a desired bond line, the grease may be compressed between the die and the heat spreader to form an assembly. Subsequently, the assembly is exposed to UV light in order to initiate a cross-linking reaction at the exposed edges of the assembly. The stiffened cross-linked material at the edges of the assembly may mitigate material pump-out and/or creep, while the majority of the thermal interface material remains compliant. Such properties may be particularly advantageous in applications where highly compliant thermal interface materials are required. It will be appreciated that the operations shown in FIG. 4 are for illustrative purposes only and that the operations may be performed in alternative orders, at alternative times, by a single entity or by multiple entities, or a combination thereof. For example, one entity may form a grease that includes UV curable cross-linkers, while another entity may apply the grease to a surface of the electrical component and/or a surface of a heat spreader prior to forming an assembly by compressing the grease between the electrical component and the heat spreader (illustrated as operations 402 and 404 in FIG. 4). In some cases, the same entity or a different entity may expose the assembly to UV light to form a thermal interface material structure that includes a selectively cross-linked thermal interface material (illustrated as operation 406 in FIG. 4).

The process 400 includes applying a grease that includes UV curable cross-linkers to a surface of an electrical component (e.g., a die) and/or a surface of a heat spreader, at 402. For example, referring to the top portion of FIG. 2, the grease 206 (that includes the UV curable cross-linkers 208) may be applied to the surface of the die 220. While not shown in the example illustrated in FIG. 2, the grease 206 may alternatively and/or additionally be applied to a surface of the heat spreader 222.

The process 400 includes forming an assembly by compressing the grease between the electrical component and the heat spreader, at 404. For example, referring to the bottom portion of FIG. 2, after application of the grease 206 to the surface of the die 220, the grease 206 may be compressed between the die 220 and the heat spreader 222 to form the assembly 224.

The process 400 includes exposing the assembly to UV light to form a thermal interface material structure that includes a selectively cross-linked thermal interface material, at 406. For example, referring to FIG. 2, exposure of the assembly 224 to the UV light 210 may initiate a cross-linking reaction along the exposed edges of the assembly 224. As described previously herein, the UV curable cross-linkers 208 may include a variety of materials, and a particular wavelength of the UV light 210 is appropriate to initiate a cross-linking reaction for the particular material(s). In the illustrative, non-limiting example depicted in FIG. 2, the UV curable cross-linkers 208 include a coumarin material that undergoes reversible photodimerization when exposed to UV light having a wavelength that is greater than 350 nm.

While not shown in the example of FIG. 4, in cases where the UV curable cross-linkers 208 have the ability to undergo reversible photodimerization, the process 400 may further include exposing the selectively cross-linked thermal interface material 202 to UV light of an appropriate wavelength to reverse the dimerization reaction. For example, in the illustrative, non-limiting example depicted in FIG. 2, the photodimerization reaction may be reversed when the selectively cross-linked thermal interface material 202 is exposed to UV light having a wavelength that is less than 260 nm. As previously described herein, the ability to reverse the cross-linking reaction may enable rework operations to be performed without the potential device damage and material waste associated with typical thermal interface rework procedures, among other benefits.

Thus, FIG. 4 illustrates an example of a process of forming a selectively cross-linked thermal interface material. For applications where highly compliant thermal interface materials are required, the selectively cross-linked thermal interface material formed according to the process depicted in FIG. 4 may be advantageous because the majority of the thermal interface material remains compliant, while the edges are stiffened to mitigate material pump-out and/or creep.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A thermal interface material structure comprising a selectively cross-linked thermal interface material, the selectively cross-linked thermal interface material including a first area having ultraviolet (UV) curable cross-linkers in a cross-linked state and a second area having the UV curable cross-linkers in a non-crosslinked state, wherein the selectively cross-linked thermal interface material corresponds to a single thermal interface material layer that defines an interface between a die and a heat spreader, and wherein the first area corresponds to outer edges of the interface.

2. The thermal interface material structure of claim 1, wherein the selectively cross-linked thermal interface material is formed from a selectively cross-linked putty pad.

3. The thermal interface material structure of claim 1, wherein the selectively cross-linked thermal interface material is formed from a grease that includes the UV curable cross-linkers.

* * * * *